(12) United States Patent
Lee

(10) Patent No.: US 6,363,518 B1
(45) Date of Patent: Mar. 26, 2002

(54) AUTOMATED POSITIONING OF RELATIVE INSTANCES ALONG A GIVEN DIMENSION

(75) Inventor: Tsu-Chang Lee, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 1289 days.

(21) Appl. No.: 08/692,612

(22) Filed: Aug. 6, 1996

Related U.S. Application Data

(63) Continuation of application No. 08/147,871, filed on Nov. 4, 1993, now abandoned.

(51) Int. Cl.$^7$ ............................................. G06F 17/50
(52) U.S. Cl. ................................ 716/10; 716/8; 716/2; 703/1
(58) Field of Search ................................ 364/578, 488, 364/489, 490, 491, 468.05, 468.06; 395/207, 208, 209; 703/1; 716/2, 8, 10

(56) References Cited

U.S. PATENT DOCUMENTS

| | | | | |
|---|---|---|---|---|
| 4,648,023 A | * | 3/1987 | Powell ........................ | 364/401 |
| 4,744,026 A | * | 5/1988 | Vanderbei ................... | 364/402 |
| 4,901,260 A | * | 2/1990 | Lubachevsky .............. | 364/578 |
| 4,924,386 A | * | 5/1990 | Freedman et al. .......... | 364/402 |
| 4,965,739 A | * | 10/1990 | Ng .............................. | 364/491 |
| 5,016,170 A | * | 5/1991 | Pollalis et al. .............. | 364/402 |
| 5,050,077 A | * | 9/1991 | Vincent ....................... | 364/401 |
| 5,050,090 A | * | 9/1991 | Golub et al. ................ | 364/478 |
| 5,097,422 A | * | 3/1992 | Corbin, II et al. .......... | 364/491 |
| 5,124,912 A | * | 6/1992 | Hotaling et al. ............ | 364/401 |
| 5,155,679 A | * | 10/1992 | Jain et al. .................... | 364/402 |
| 5,260,868 A | * | 11/1993 | Gupta et al. ................ | 364/402 |
| 5,309,371 A | * | 5/1994 | Shikata et al. .............. | 364/491 |
| 5,351,197 A | * | 9/1994 | Upton et al. ................ | 364/491 |
| 5,355,314 A | * | 10/1994 | Feigenbaum ................ | 364/420 |
| 5,363,313 A | * | 11/1994 | Lee ............................. | 364/491 |
| 5,369,596 A | * | 11/1994 | Tokumaru ................... | 364/491 |
| 5,404,312 A | * | 4/1995 | Tawada ....................... | 364/491 |
| 5,416,722 A | * | 5/1995 | Edwards ..................... | 364/491 |

OTHER PUBLICATIONS

Tsay et al., "Proud: A Sea–of–Gates Placement Algorithm", IEEE Design & Test of Computers, vol. 5, No. 6, Dec. 1988, pp. 44–56.*
Dr. S. Vajda, "Readings in Linear Programming", John Wiley & Sons, Inc., 1958, pp. 1–2 and 25–33.*
Jensen et al., "Network Flow Programming", John Wiley & Sons, Inc., 1980, pp. 1–10, 59–87, and 339–390.*
Steven Nahmias, "Production and Operations Analysis", Richard D. Irwin, Inc., 1989, pp. 306–315 and 340–343.*
Thomas Saaty, "Operations Management: The New 2001 Approach", Joseph M. Katz Graduate School of Business, 1990–1991, Chapter 8 pp. 1–39 and Chapter 12 pp. 1–13.*

* cited by examiner

Primary Examiner—Eric B. Stamber
(74) Attorney, Agent, or Firm—Lyon & Lyon LLP

(57) ABSTRACT

A computer-automated tool re-positions an instance relative to another instance along a given dimension. First, positions of both instances along the given dimension are determined. Then, a modified position is determined for one instance according to a convex function, which defines a global minimum solution between the initial instance positions.

9 Claims, 6 Drawing Sheets

AUTOMATED POSITIONING OF RELATIVE INSTANCES ALONG A GIVEN DIMENSION

RELATED APPLICATIONS

This is a continuation of application Ser. No. 08/147,871, filed on Nov. 4, 1993 now abandoned.

BACKGROUND OF THE INVENTION

1. Field of the Invention

The invention relates to positioning techniques, particularly to a computer-aided technique for positioning objects or events relatively along a specified dimension, such as time or space.

2. Description of the Background Art

To handle numerous, tedious tasks which arise typically when organizing or designing complex systems, computer-aided tools are often used for managing the complexity. In this regard, computers are well-suited for monitoring and processing large amounts of general information, particularly "instances" of objects or events, and their relative positions and durations.

For example, instance management may be handled by computer-based applications for designing and simulating various prototype systems, including electronic, mechanical, chemical, and even management planning systems. In such applications, a computer may be used generally to determine relative instance positions along a given dimension, such as object placement along a straight line segment or event scheduling during a continuous time span.

In each computer application, certain constraints on instance positioning may be imposed on the prototype system, either preferably (i.e., "soft" constraints) or necessarily (i.e., "hard" constraints). Moreover, in particular applications, constraint violation may occur due to object or event congestion arising in a given prototype system. Accordingly, it would be desirable to provide an improved technique for relative instance positioning which reduces or eliminates the occurrence of such constraint violations.

SUMMARY OF THE INVENTION

The invention resides in a computer-assisted facility for positioning a first object or event relative to a second object or event respectively along a spacial or temporal dimension. Initially, a first position of the first object or event and a second position of the second object or event are determined along the spacial or temporal dimension. Then, a third position is determined for re-positioning the first object or event according to a function having a minimum between the first and second positions.

Preferably, the function is a convex function having a global minimum solution, such as a potential energy function which models physical compression of a spring. Additionally, each object or event is defined with hard and soft constraints along the spacial or temporal dimension, respectively, wherein the soft constraints are modified to determine the third position of the first object or event.

DESCRIPTION OF THE PREFERRED EMBODIMENT

Figure 1:
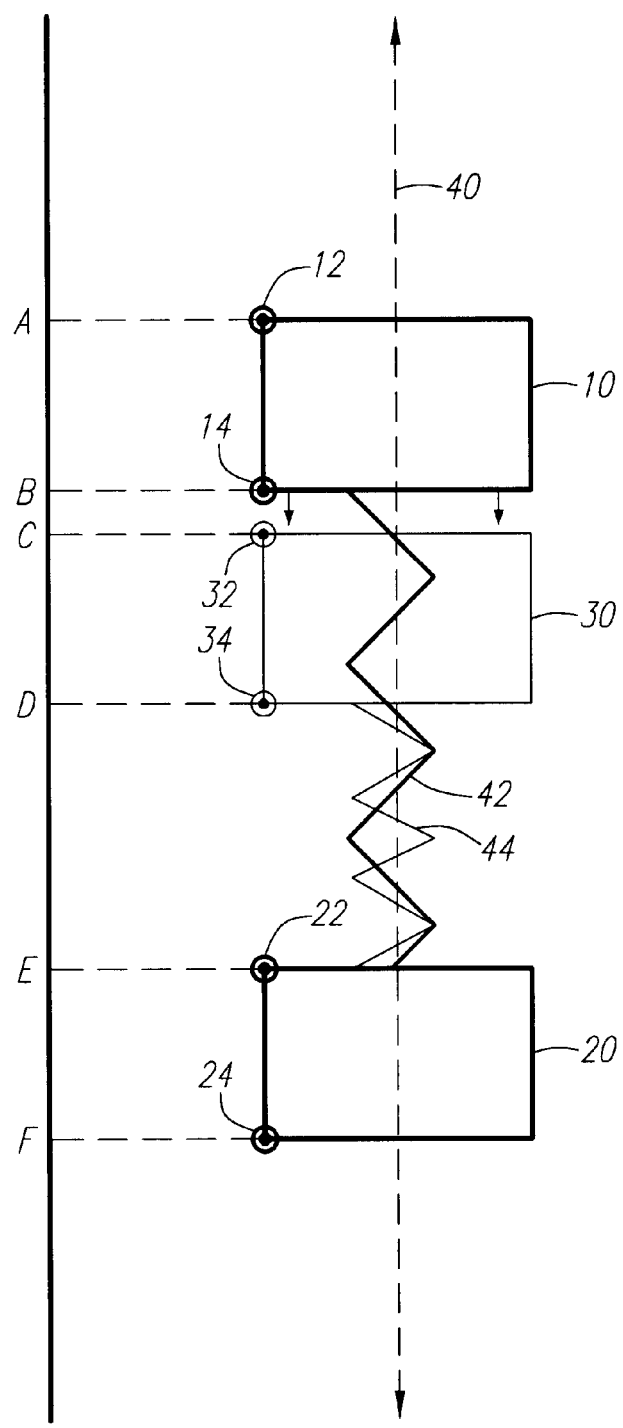
FIG. 1 is a simplified block diagram showing relative instances 10, 20, wherein instance 10 is re-positioned 30 along dimension 40.

FIG. 1 is a simplified block diagram showing first physical or temporal instance 10 (i.e., objects or events) positioned or disposed relative to second physical or temporal instance 20 along given or pre-specified physical or temporal dimension 40. Preferably, computer-implemented automation system 50, as shown in the simplified block diagram of FIG. 2 having conventional processor 52 and storage 54, re-positions 39 first instance 10 along dimension 40 according to the present invention.

Generally, system 50 functions as a computer-assisted instance manager for designing or simulating prototype systems, including electronic, mechanical, chemical, or management planning systems. In particular, processor 52 of system 50 executes simulation application programs and related software files 56 which are accessible from storage 54 or other networked resources. In this way, system 50 manages instances of objects and events and their relative positions and durations, particularly to determine relative instance positions along given dimensions, such as object placement along straight line segments or event scheduling during continuous time spans.

When operating, system 50 initially determines or receives 51 placement or positions of instances 10, 20 along dimension 40, possibly using conventional techniques for instance placement or positioning. For example, in FIG. 1 instance 10 is positioned initially along dimension 40, such that reference origins 12, 14 are aligned respectively with points A, B; and instance 20 is positioned initially along dimension 40, such that reference origins 22, 24 are aligned respectively with points E, F.

Figure 2:
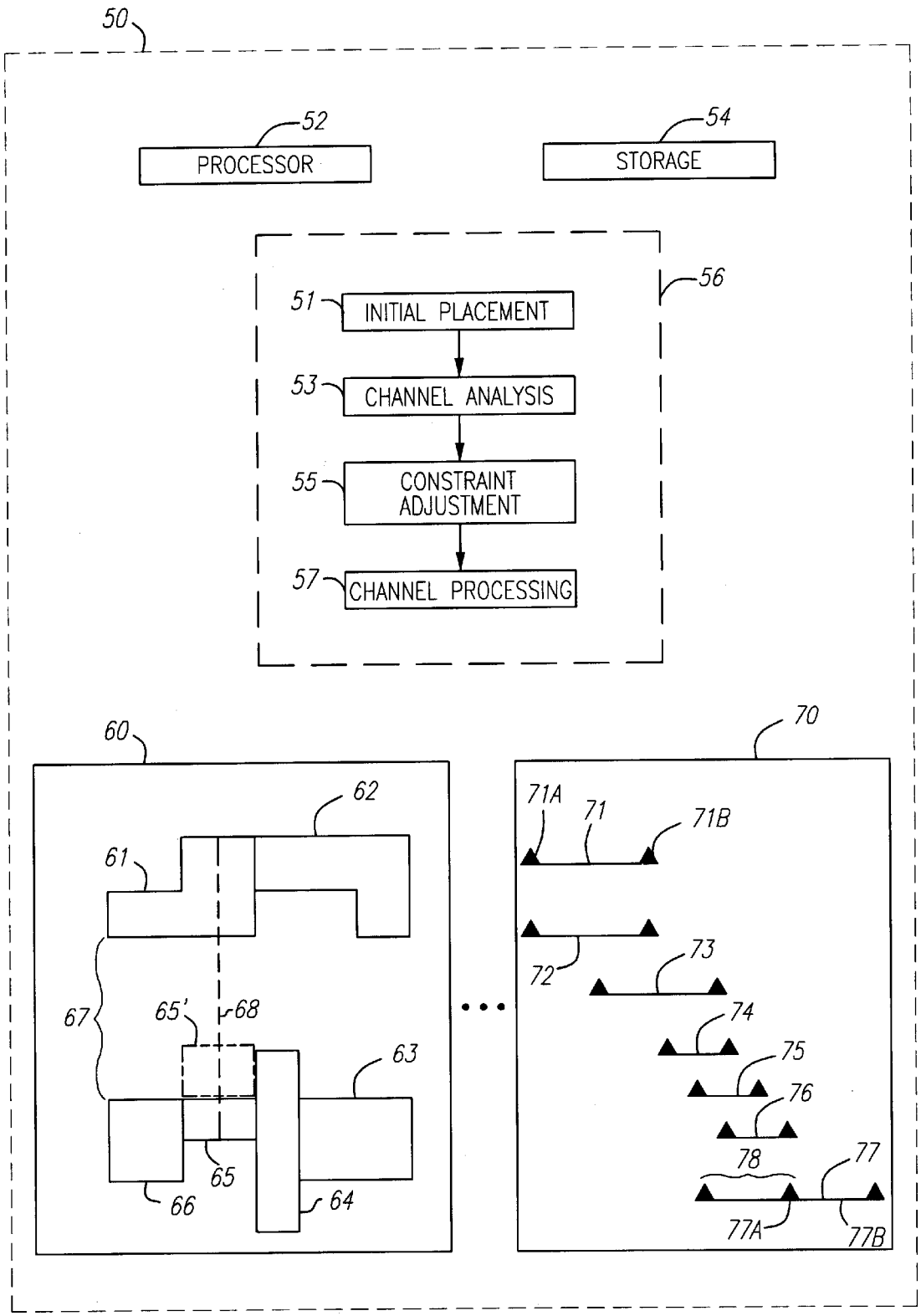
FIG. 2 is a simplified block diagram of computer-implemented system 50 for automated instance positioning, including diagrams showing physical 60 and temporal 70 instance positioning.

Additionally, in FIG. 2, sample graphical display diagrams 60, 70 of representative prototype systems show possible forms of initial instance placement 51. For example, diagram 60 shows initially-positioned rectilinear or rectangular objects 61–66, which represent or simulate various physical blocks or circuit cells physically or spatially laid-out on a semiconductor, board or other electronic substrate according to an integrated circuit or system design. Also, diagram 70 shows initially-positioned line segments 71–77 which represent or simulate various events or time spans temporally occurring or scheduled according to a computerized project calendar or other management plan.

Depending on the particular application, certain time segments may have fixed or non-overlapping (i.e., hard) or variable (i.e., soft) constraints which define the extent of allowable re-positioning of such time segments. For example, a fixed constraint may prevent temporal overlapping between segments 77, 78, but a soft constraint may permit segment 78 to be extended from end 77A to end 77B, thereby resulting in overlapping segments 77, 78.

After performing initial placement 51, system 50 identifies and analyzes 53 a segment, channel or gap of space 67 or time 78 aligned along dimension 40 between reference origins 14, 22 of instances 10, 20. Channel analysis 53 is used initially by system 50 to determine a revised or adjusted position 55 for re-positioning 30 instance 10 to reference origins 32, 34 relative to instance 20, for example, when necessary or desirable to reduce or eliminate channel congestion resulting from crowded placement of overlapping, neighboring or nearby instances.

As part of channel analysis 53, system 50 considers or builds a map of pre-specified ranges or discrete constraints or limitations placed on each or certain instance positioning in a given dimension 40, which may have been imposed or defined on the particular prototype system under simulation or verification. Constraints may be characterized for each instance along a particular dimension as either preferred or adjustable (i.e., "soft" constraints) or necessary or fixed (i.e., "hard" constraints), depending on user specification or the particular application.

For example, in a spatial dimension 40, bottom edge 14 of, or point A corresponding to, object-instance 10 is restricted by a hard constraint (e.g., against object physical overlap) from being re-positioned closer than upper edge 22 of, or point E corresponding to, object-instance 20. Similarly, in the spatial dimension, referring to diagram 60 in FIG. 2, such hard constraint may prevent object-instance 61 from being re-positioned to overlap physically with corresponding object-instances 65, 66.

Similarly, in a temporal dimension, in diagram 70 in FIG. 2, event-instances 71, 72 may be restricted by certain specified hard constraints against temporal overlap with other, related event-instances 74–77. Additionally, in either spatial or temporal dimension, various soft constraints may be imposed depending on user specification or other prototype system or application requirement, even when no instance overlap violation would exist. Preferably, soft constraints specified along particular dimensions 40 define and limit the dimensional channel or gap defined therebetween for evaluation according to channel analysis 53.

Channel analysis 53 also involves processor 52 evaluating a pre-specified function, equation or relationship having a global minimum (or maximum) solution disposed or positioned between initial positions of instances 10, 20. Preferably, to specify such function in an application for simulating a particular prototype system, a system user defines to processor 52 a potential energy, spring, or similarly convex (or concave) function for physically compressing or stretching a simulated mechanical spring or coil 42, 44 hypothetically disposed between instances 10, 20. In this way, the function models the potential energy of spring 42, 44 for compression or stretching between initial positions of instances 10, 20 along dimension 40.

Thus, by calculating a value for the global minimum (or maximum) solution, processor 52 may determine an adjustment or modification 55 of a particular, or each, soft constraint, thereby also determining, based on a smooth graph relaxation 55 of certain soft constraints, a corresponding position 30, 65' for re-positioning instance 10, 65. Preferably, the value is calculated using a gradient descent or conjugate gradient technique, and also such value is calculated only when each instance satisfies all applicable hard constraints (i.e., no temporal or spatial overlap violations are detected by processor 52).

Upon completing constraint adjustment 55 to re-position certain over-strained instances in the prototype design, processor 52 may perform various channel processing, such as electrical interconnect routing between re-positioned instances, or generate screen displays and related files which represent the re-positioned instances.

Figure 3:
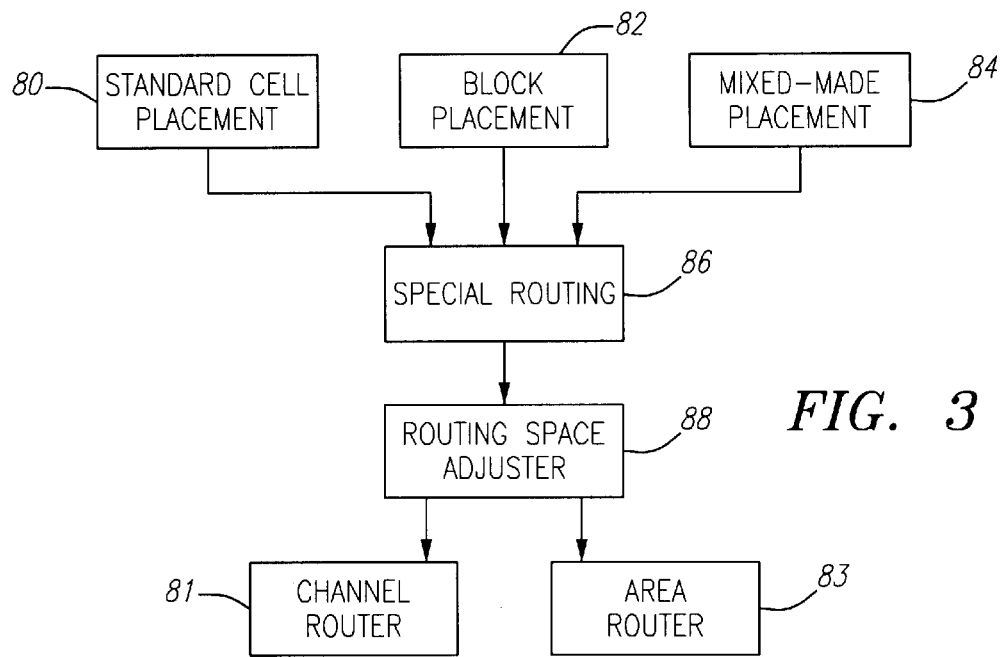
FIG. 3 is a generalized flow chart of a computer-aided process for integrated circuit or system design, including, in particular, routing space adjuster 88, which is detailed further in the flow chart shown in FIG. 4. Also, the flow chart shown in FIG. 5 details further one-dimensional spacer step 93 included in routing space adjuster 88 of FIG. 4.

In a preferred embodiment, a computer-aided electronic design system includes conventional software tools for placing standard cells 80, circuit blocks 82, mixed-mode or other components 84, as shown generally in FIG. 3. Such placement tools 80, 82, 84 generate an electronic placement file which defines the placement for a prototype circuit or system, and which is received by special routing tools 86 for routing the special connections, such as power/ground and clock nets, on a circuit board or semiconductor substrate.

After special routing, congestion is estimated using a fast global routing technique. If congestion arises in the estimation, a routing space adjuster 88 software routine is called automatically to re-position certain components, according to the present invention. Then, after the components are re-positioned satisfactorily, conventional channel routing 81 and/or area routing 83 may proceed to complete the lay-out process.

Figure 4:
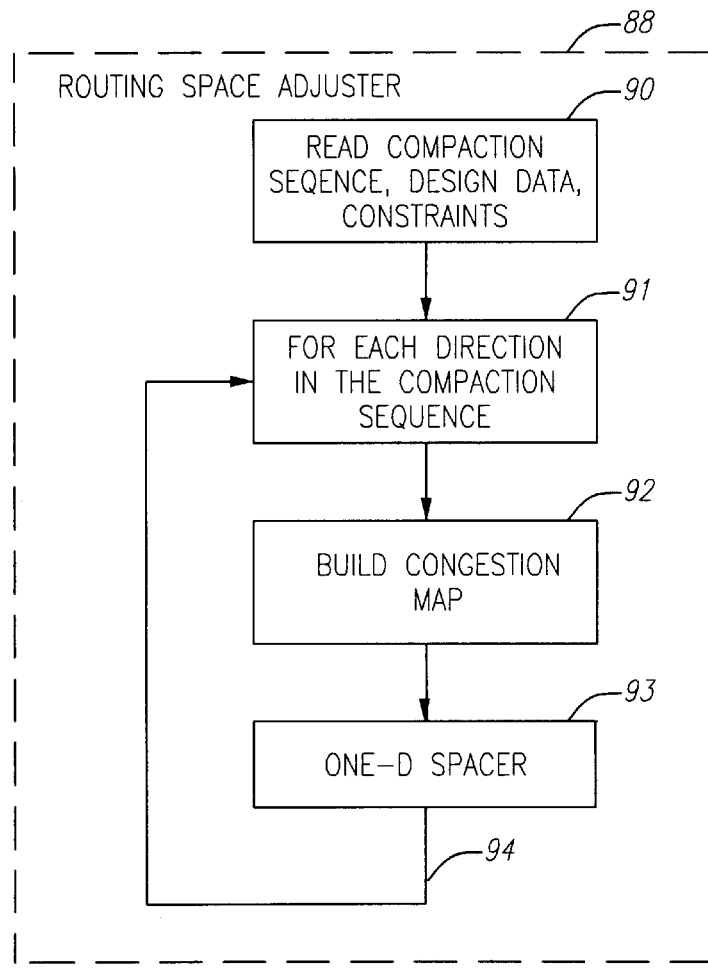
Figure 5:
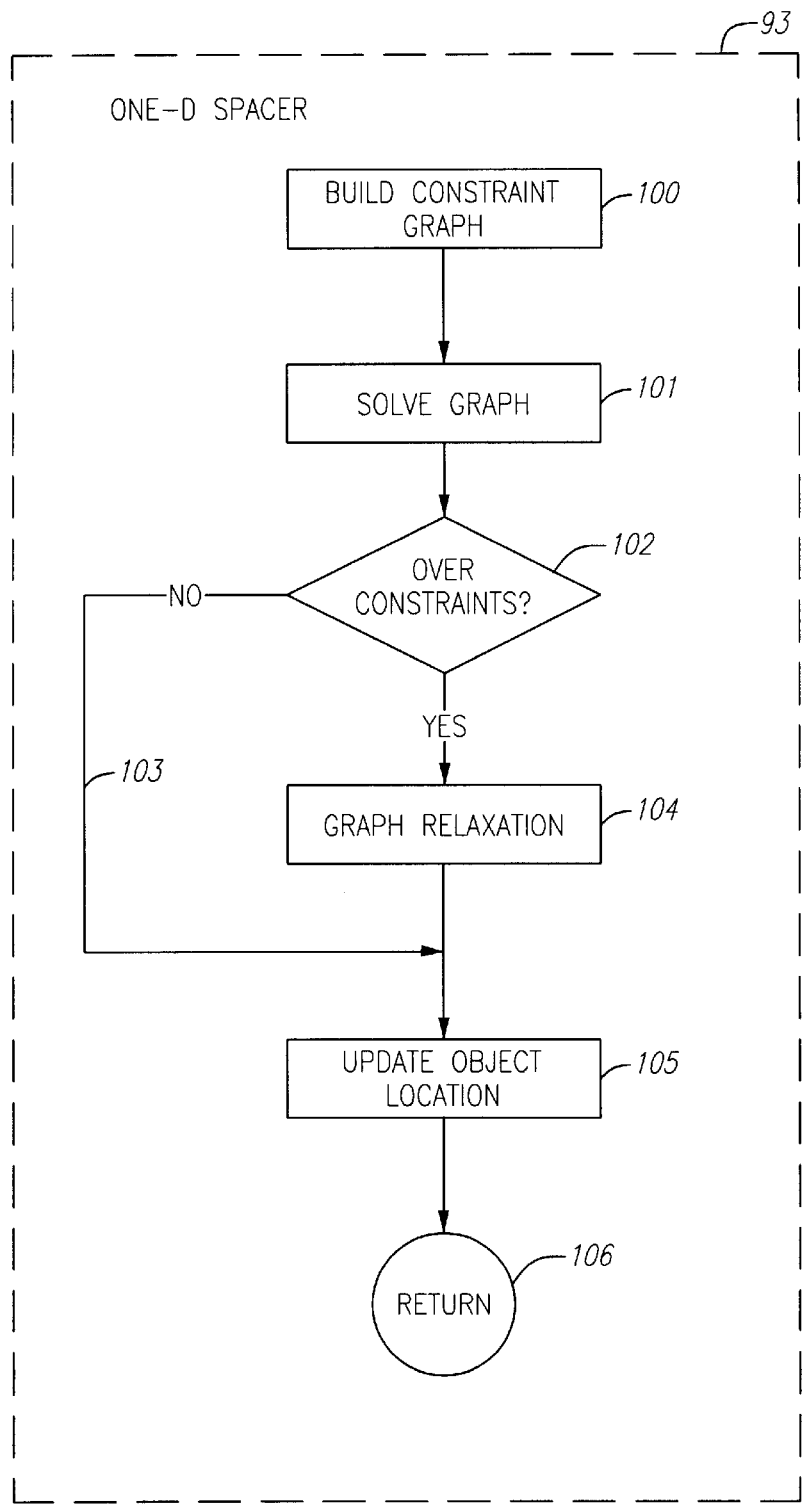

In FIG. 4, routing space adjuster 88 is shown including initially a step for reading component compaction sequence along a particular direction, design data defining components and related interconnection, and hard and soft constraint information 90 for the particular design. Then, for each direction designated (e.g., up, down, left, right) in the compaction sequence 91, a congestion map is built 92, and a one-dimensional spacer or component re-placement routine 93 is invoked, as illustrated in the flow chart of FIG. 5. In one embodiment congestion map 92 is built graphically.

Figure 6:
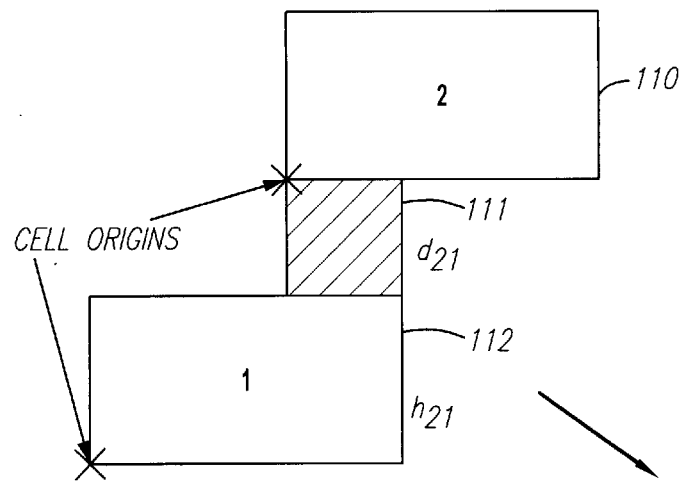
FIG. 6 is a block diagram of two representative objects 110, 112.

To explain how one-dimensional spacer 93 works, a pair of preliminarily-placed components ("block 1") 110, ("block 2") 112, shown in FIG. 6, having cell origins separated 111 by distance $d_{12}$ and height $h_{12}$, are provided for compaction along an up-down direction. Then, a constraint graph, shown in FIG. 7, is built to identify all components and determine relative physical positions, particularly each applicable constraint limitation 122, 123 existing between each pair of un-obstructed, neighboring components 120, 121.

Next, the generated graph is solved 101 to determine possible component placements according to hard (i.e., over-lapping limitations) or soft (i.e., channel spacing) constraints. In particular, it is determined whether over-constraints that violate soft and/or hard constraints 102 would arise for the given component placement. If no over-constraints arise 103, then the calculated locations for component placement are updated 105, and the routing process continues 106.

However, when an over-constraint component placement is indicated, graph relaxation 104 is performed automatically, preferably by calculating and minimizing an "energy" value among all components in the prototype design. The process of graph relaxation 104 involves the steps of setting initial node locations in the constraint graph, setting a graphical convex equation or energy function, as shown in FIG. 8 corresponding to the two-component design of FIGS. 6 and 7, and then calculating node equivalent locations according to the energy function.

Figure 7:
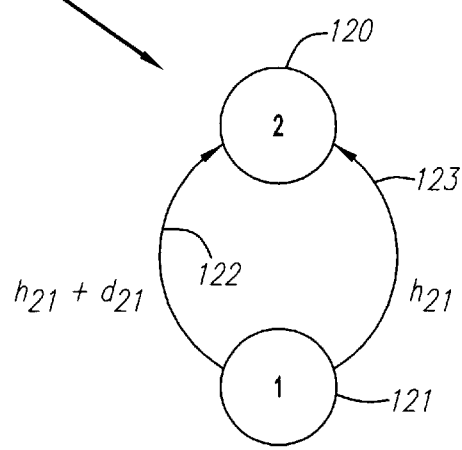
FIG. 7 is a congestion map which graphs constraints corresponding to objects 110, 112 of FIG. 6.
Figure 8:
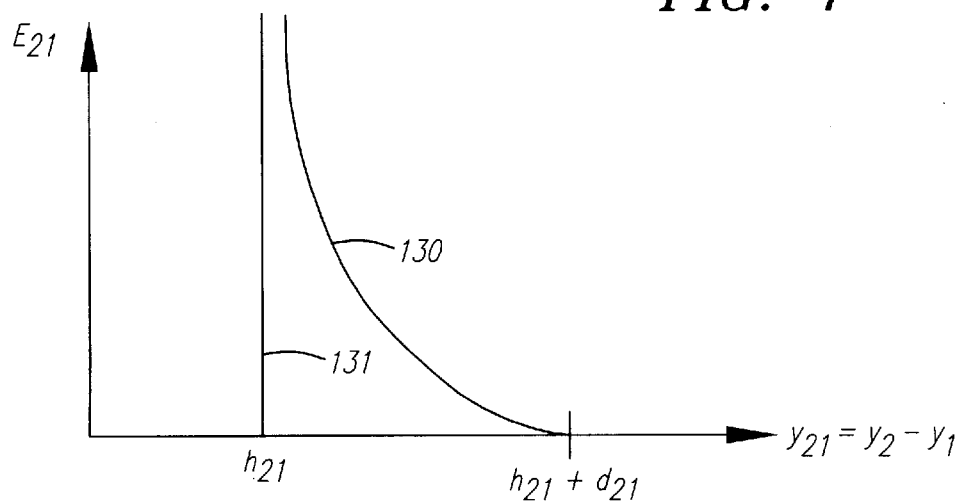
FIG. 8 is a graph representing potential energies calculated for placement of objects 111, 112 of FIG. 6 at various re-placement positions.

Thus, in the example illustrated in FIGS. 6–8, congestion analysis is applied to components 110, 112 having channel distance 111 therebetween. In this arrangement, height of block 112 is the minimum space or hard constraint between origins of blocks 110, 112, without resulting in component overlap, and height plus distance 111 is channel spacing or soft constraint.

In accordance with the present invention, graph relaxation 104 serves to relax or adjust soft constraint by modeling the channel region as a hypothetical compressible spring. By compressing the spring between blocks 110, 112, "potential energy" $E_{12}$ is generated, as shown in FIG. 8. Various convex (or concave) functions may be used to model such energy, as long as a global minimum (or maximum) solution within the spacing range may be calculated for the function. In this way, component placement is determined to satisfy a minimum (or maximum) energy point.

Preferably, energy is defined by a convex function as infinite 131 for $Y_{21}$ less or equal than $h_{21}$, and zero when $y_{21}$ is greater than $(h_{21}+d_{21})$. Additionally, for $Y_{21}$ between $h_{21}$ and $(h_{21}+d_{21})$, $E_{21}$ is defined 130 as follows:

$$E_{21} = k_{21}(1-r)^2 \quad \text{if } q < r < = 1$$
$$k_{21} \times q \times (1-q)^2 / r \quad \text{if } 0 < r < = q$$

where $r=(Y_{21}-h_{21})/d_{21}$, q is a factor smaller than 1, and k is a user-defined constant. Note that the foregoing $E_{21}$ equation defines energy for $Y_{21}>=h_{21}+d_{21}$ constraints; similarly, $Y_{21}<=h_{21}+d_{21}$ constraints may be defined.

Figure 9:
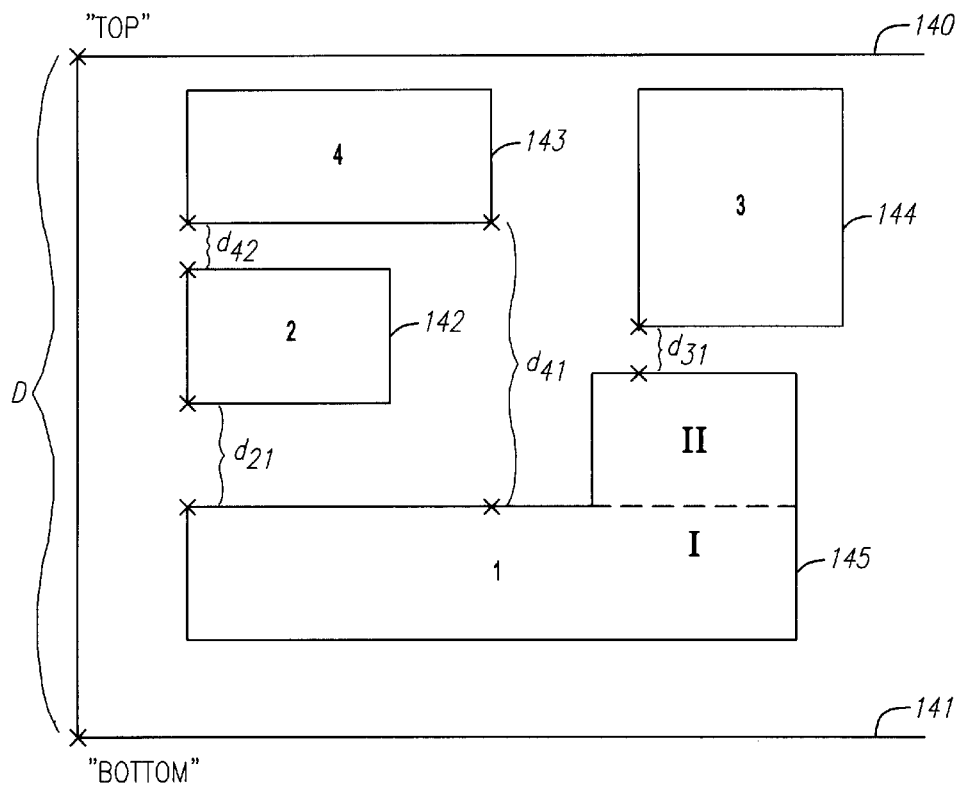
FIG. 9 is a block diagram of four representative objects 142, 143, 144, 145 placed between top 140 and bottom 141 boundaries.

Another prototype design having multiple components 142–145 placed between top and bottom boundaries 140, 141 is shown in the block diagram of FIG. 9. In this arrangement, boundaries 140, 141 define distance D, and various un-obstructed channel spacings or distances $d_{21}$, $d_{41}$, $d_{42}$, and $d_{31}$ are shown between components 142–145. Note that one component 145 may be decomposed and treated as two abutted, rectangular components I, II, for purposes of determining relative component spacings.

Figure 10:
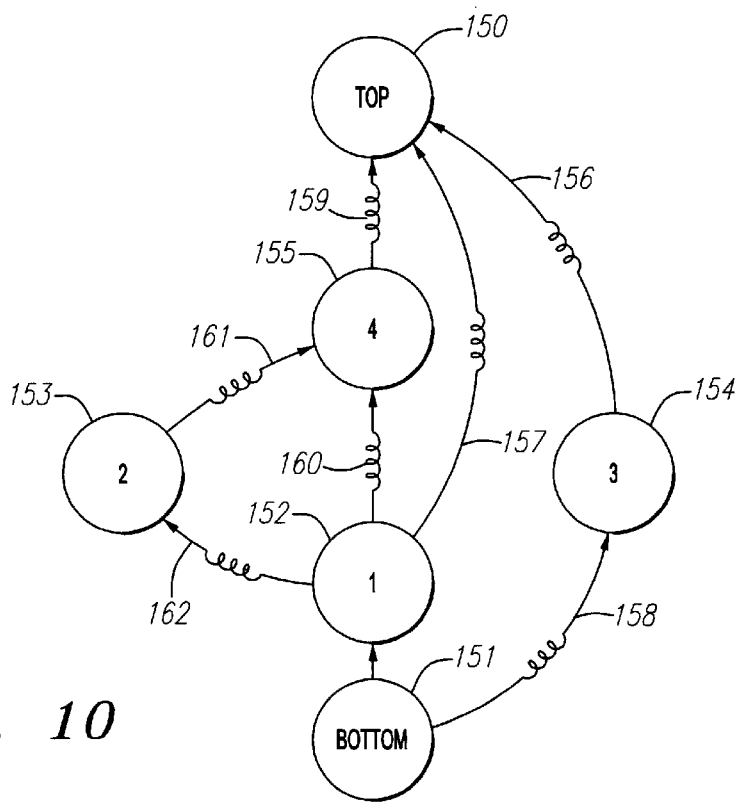
FIG. 10 is the constraint graph for objects 142, 143, 144, 145 of FIG. 9.

In FIG. 10, a constraint graph is generated corresponding to the system of FIG. 9 showing nodes 150–155 and hypothetical springs 156–162 disposed therebetween. Total energy for the system is calculated as the sum of each potential energy $E_{ij}$, where i, j are neighboring nodes in the graph, and each $E_{ij}$ being defined by a convex (or concave) function having a global minimum (or maximum) solution within a specified range between nodes. Component placement is determined by re-positioning each component at a location along the compaction direction which coincides with its corresponding, calculated minimum (or maximum) solution, thereby minimizing (or maximizing) the total system energy.

In particular, by using a gradient descent or conjugate gradient algorithm, optimal graph node locations are calculated. By summing potential energies $E_{ij}$ for each neighboring node pair, various overconstraints are distributed effectively among the soft constraint edges of multiple components. Also, by changing variables $k_{ij}$, $q_{ij}$, overconstraint distribution may be tailored to particular design requirements.

I claim:

1. In a computer based system comprising a storage device coupled to a processor, the method for modifying a distance between a plurality of objects, each of the objects representing one of blocks, components, and circuit cells in a physical circuit design, the method comprising the steps of:

(a) determining a position of a first object and a second object of said plurality of objects in a physical circuit design;

(b) selecting an axis in said physical circuit design;

(c) determining a first limitation and a second limitation between said first object and said second object, said first limitation representing an absolute minimum separation between said first object and said second object along said selected axis, said second limitation representing a desired minimum separation between said first object and said second object along said selected axis;

(d) determining if said plurality of objects form an over-constrained system, said over-constrained system occurring if said positions of said plurality of objects cause a violation of one of said first limitation and said second limitation;

(e) automatically determining a first value representing a degree of said violation for each of said violations determined in step (d), including the steps of:

(1) obtaining a function from one of a user and the storage device, said function defining a convex function representing a potential energy of a hypothetical elastic device coupled between said first object and said second object along said selected axis; and (2) determining, in the processor, said first value as a global minimum solution for said function;

(f) determining a second value representing a combination of all of said first values determined in step (e);

(g) repeating steps (b)–(f) for a plurality of axes; and (h) determining a third value representing a combination of each of said second values associated with each of said selected axes as determined in step (f), said third value representing a distance between each of the plurality of objects;

(i) modifying the distance between said first object and said second object.

2. The method of claim 1, further comprising the steps of:

(j) repeating steps (a)–(i); and (k) modifying the distance between said first object and said second object if said third value associated with said modified first objects is more optimal than said third value associated with said unmodified objects.

3. The method of claim 1, after step (b), further comprising the steps of:

determining a third limitation and a fourth limitation between said first object and a third of said plurality of objects, said third limitation representing an absolute minimum separation between said first object and said third object along said selected axis, said fourth limitation representing a desired minimum separation between said first object and said third object along said selected axis; and determining a fifth limitation and a sixth limitation between said second object and said third object, said fifth limitation representing an absolute minimum separation between said second object and said third object along said selected axis, said sixth limitation representing a desired minimum separation between said second object and said third object along said selected axis.

4. A computer readable memory capable of directing a computer to operate in accordance with the method of claim 1.

5. A computer program embodied in a tangible medium and capable of being read by a computer, for performing the method of claim 1.

6. In a computer based system comprising a storage device coupled to a processor, the method for modifying a distance between a plurality of objects, each of the objects representing one of blocks, components, and circuit cells in a physical circuit design, the method comprising the steps of:

(a) determining a position of a first object and a second object of said objects in a physical circuit design;

(b) selecting an axis in said physical circuit design;

(c) determining a first limitation and a second limitation between said first object and said second object, said first limitation representing an absolute minimum separation between said first object and said second object along said selected axis, said second limitation representing a desired minimum separation between said first object and said second object along said selected axis;

(d) determining if said plurality of objects form an over-constrained system, said over-constrained system occurring if said positions of said plurality of objects cause a violation of one of said first limitation and said second limitation;

(e) automatically determining a first value representing a degree of said violation for each of said violations determined in step (d), including the steps of:

(1) obtaining a function from one of a user and the storage device, said function defining a concave function representing a potential energy of a hypothetical elastic device coupled between said first object and said second object along said selected axis;

(2) determining, in the processor, said first value as a global maximum solution for said function. (f) determining a second value representing a combination of all of said first values determined in step (e);

(g) repeating steps (b)–(f) for a plurality of axes; and (h) determining a third value representing a combination of each of said second values associated with each of said selected axes as determined in step (f), said third value representing a distance between each of the plurality of objects;

(i) modifying the distance between said first object and said second object.

7. The method of claim 6, further comprising the steps of:

(j) repeating steps (a)–(i); and (k) modifying the distance between said first object and said second object if said third value associated with said modified first objects is more optimal than said third value associated with said unmodified objects.

8. The method of claim 6, after step (b), further comprising the steps of:

determining a third limitation and a fourth limitation between said first object and a third of said plurality of objects, said third limitation representing an absolute minimum separation between said first object and said third object along said selected axis, said fourth limitation representing a desired minimum separation between said first object and said third object along said selected axis; and determining a fifth limitation and a sixth limitation between said second object and said third object, said fifth limitation representing an absolute minimum separation between said second object and said third object along said selected axis, said sixth limitation representing a desired minimum separation between said second object and said third object along said selected axis.

9. A computer readable memory capable of directing a computer to operate in accordance with the method of claim 6.

* * * * *

UNITED STATES PATENT AND TRADEMARK OFFICE
CERTIFICATE OF CORRECTION

PATENT NO. : 6,363,518 B1
DATED : March 26, 2002
INVENTOR(S) : Tsu-Chang Lee

It is certified that error appears in the above-identified patent and that said Letters Patent is hereby corrected as shown below:

Column 1,
Line 64, immediately after "of", please insert -- a --

Column 2,
Line 27, please replace "re-positions 39" with -- re-positions 30 --.

Colunm 5,
Line 22, immediately before "$k_{21}$ x q x $(1-q)^2/r$," please insert -- = --.

Column 7,
Line 31, please align step (f) on a new line under (e).

Signed and Sealed this

First Day of October, 2002

Attest:

JAMES E. ROGAN
Attesting Officer
Director of the United States Patent and Trademark Office